United States Patent
Ohara

(10) Patent No.: US 7,067,423 B2
(45) Date of Patent: Jun. 27, 2006

(54) ELECTROLESS PLATING APPARATUS, SEMICONDUCTOR WAFER HAVING BUMPS, SEMICONDUCTOR CHIP HAVING BUMPS, METHODS OF MANUFACTURING THE SEMICONDUCTOR WAFER AND THE SEMICONDUCTOR CHIP, SEMICONDUCTOR DEVICE, CIRCUIT BOARD, AND ELECTRONIC EQUIPMENT

(75) Inventor: Hiroshi Ohara, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 332 days.

(21) Appl. No.: 10/267,700

(22) Filed: Oct. 10, 2002

(65) Prior Publication Data

US 2003/0080083 A1     May 1, 2003

(30) Foreign Application Priority Data

Oct. 25, 2001   (JP) ............................. 2001-327238
Aug. 26, 2002   (JP) ............................. 2002-244822

(51) Int. Cl.
*H01L 21/44* (2006.01)

(52) U.S. Cl. ...................... 438/678; 438/612; 438/613; 205/117; 205/118

(58) Field of Classification Search .................... None
See application file for complete search history.

(56) References Cited

U.S. PATENT DOCUMENTS 5,290,732 A * 3/1994 Kumar et al. .................. 216/13
6,709,901 B1 * 3/2004 Yamazaki et al. ........... 438/149

* cited by examiner

*Primary Examiner*—Dung A. Le
(74) *Attorney, Agent, or Firm*—Oliff & Berridge, PLC

(57) ABSTRACT

An electroless plating apparatus includes: a storage tank for an electroless plating solution; a blocking member which blocks the electroless plating solution from flowing from a treatment side of a semiconductor wafer installed to the storage tank toward an opposite side to the treatment side, the treatment side being a side facing the electroless plating solution; and a solution supplier which causes the electroless plating solution to flow so that the electroless plating solution comes in contact with the treatment side of the semiconductor wafer.

14 Claims, 9 Drawing Sheets

ELECTROLESS PLATING APPARATUS, SEMICONDUCTOR WAFER HAVING BUMPS, SEMICONDUCTOR CHIP HAVING BUMPS, METHODS OF MANUFACTURING THE SEMICONDUCTOR WAFER AND THE SEMICONDUCTOR CHIP, SEMICONDUCTOR DEVICE, CIRCUIT BOARD, AND ELECTRONIC EQUIPMENT

Japanese Patent Application No. 2001-327238 filed on Oct. 25, 2001 and Japanese Patent Application No. 2002-244822 filed on Aug. 26, 2002, are hereby incorporated by reference in their entirety.

BACKGROUND OF THE INVENTION

The present invention relates to an electroless plating apparatus, a semiconductor wafer having bumps, a semiconductor chip having bumps, methods of manufacturing the semiconductor wafer and the semiconductor chip, a semiconductor device, a circuit board, and electronic equipment.

As the degree of integration of a semiconductor integrated circuit is increased and the size of a semiconductor chip is decreased, mounting technology capable of connecting terminals at a minute pitch has been demanded. As examples of mounting technology capable of easily dealing with such a demand, TAB (Tape Automated Bonding) mounting used for a TCP (Tape Carrier Package) and flip-chip mounting used for a CSP (Chip Size Package) can be given.

In the above mounting technology, bumps are generally formed on pads of the semiconductor chip. Au bumps are typically used as the bumps and generally formed by electroplating. A method of forming Au bump electrodes by electroplating is described below.

FIG. 14 is a cross-sectional view showing an Au bump in a conventional semiconductor chip. A pad 502, which is part of an interconnect linked with an inner integrated circuit, is covered with a passivation film 504 excluding the surface of an electrical connection region.

An under-bump metal layer (laminate of a barrier metal layer and an adhesive metal layer) 506 is formed by using a sputtering method. A resist layer 508 for forming bumps is formed by using photolithographic technology so that the electrical connection region of the pad 502 and its peripheral region are exposed. Au is grown by electroplating corresponding to the pattern of the resist layer 508. After removing the resist layer 508, the under-bump metal layer 506 is wet-etched corresponding to the type of the under-bump metal layer 506 using the grown Au as a mask. A bump 510 is formed by subsequent annealing and the like. A cleaning step is appropriately performed during the process. Since bump formation by electroplating is a long process, further reduction and rationalization of the process have been demanded.

To deal with this demand, formation of bumps by electroless plating has been proposed. If the bumps are formed by electroless plating, it is unnecessary to perform at least the step of forming the under-bump metal layer by sputtering and the step of etching. Moreover, it is expected that formation of a resist for growth of plating can be omitted. This enables the process to be significantly reduced, whereby the bumps are formed at low cost.

Conventionally, aluminum pads are subjected to a zincate treatment as a pretreatment for plating when forming the bumps by electroless plating. Specifically, a semiconductor wafer is immersed in a treatment solution including Zn ions, whereby the surface of the pads is replaced by Zn according to the reaction shown by $2Al+3Zn^{2+} \rightarrow 2Al^{3+}+3Zn$. The entire semiconductor wafer is then immersed in an electroless plating solution, thereby causing a plating metal to be deposited. The process may be rationalized by batch processing in which a plurality of semiconductor wafers is immersed in the plating solution.

The aluminum pads which become GND electrodes are electrically connected with an Si substrate of the semiconductor wafer. The Si substrate is electrically connected with the electroless plating solution. When electrons in the Si substrate are released into the electroless plating solution, the potential of the aluminum pads is changed. Since the amount of electrons used for a chemical reaction is decreased by such a grounding effect, ionic bonding rarely occurs, whereby replacement of the surface of the aluminum pads by Zn is insufficient in the zincate treatment. Moreover, the plating rate is changed by influence of the grounding effect, whereby deposition of the plating metal is affected.

There is a case where a resist is applied to a considerable thickness to the back side and a region near the periphery (from the periphery of the surface to the side) of the semiconductor wafer in order to prevent the influence of the grounding effect. The zincate treatment and the plating treatment are performed while preventing the electroless plating solution from coming in contact with a region near the periphery and the back side of the semiconductor wafer in this manner.

A resist is applied to the back side of the semiconductor wafer while chucking (adsorbing under vacuum) the side on which the bumps are formed (main surface of the semiconductor wafer) on a rotating table of a spin coater. In this case, the bump formation side must be prevented from being damaged so that the subsequent growth of plating is not affected.

BRIEF SUMMARY OF THE INVENTION

An electroless plating apparatus according to one aspect of the present invention comprises:
  a storage tank for an electroless plating solution;
  a blocking member which blocks the electroless plating solution from flowing from a treatment side of a semiconductor wafer installed to the storage tank toward an opposite side to the treatment side, the treatment side being a side facing the electroless plating solution; and
  a solution supplier which causes the electroless plating solution to flow so that the electroless plating solution comes in contact with the treatment side of the semiconductor wafer.

A method of manufacturing a semiconductor wafer having bumps according to a second aspect of the present invention comprises:
  installing a semiconductor wafer having a plurality of pads in a storage tank of an electroless plating solution, and blocking the electroless plating solution from flowing from a treatment side of a semiconductor wafer installed to the storage tank toward an opposite side to the treatment side by means of a blocking member, the treatment side being a side facing the electroless plating solution; and
  forming bumps on the respective pads from the electroless plating solution by allowing the electroless plating solution to flow by means of a solution supplier so that the electroless plating solution comes in contact with the treatment side of the semiconductor wafer.

A method of manufacturing a semiconductor chip having bumps according to a third aspect of the present invention comprises:

manufacturing a semiconductor wafer having bumps by using the above method, and cutting the semiconductor wafer having bumps.

A semiconductor wafer having bumps according to a fourth aspect of the present invention is manufactured by using the above method.

A semiconductor chip having bumps according to a fifth aspect of the present invention is manufactured by using the above method.

A semiconductor device according to a sixth aspect of the present invention comprises the above semiconductor chip having bumps, a substrate on which the semiconductor chip having bumps is mounted, and external terminals.

A circuit board according to a seventh aspect of the present invention includes the above semiconductor chip having bumps mounted on the circuit board.

Another circuit board according to an eighth aspect of the present invention includes the above semiconductor device mounted on the circuit board.

Electronic equipment according to a ninth aspect of the present invention comprises the above semiconductor device.

DETAILED DESCRIPTION OF THE EMBODIMENT

Figure 1:
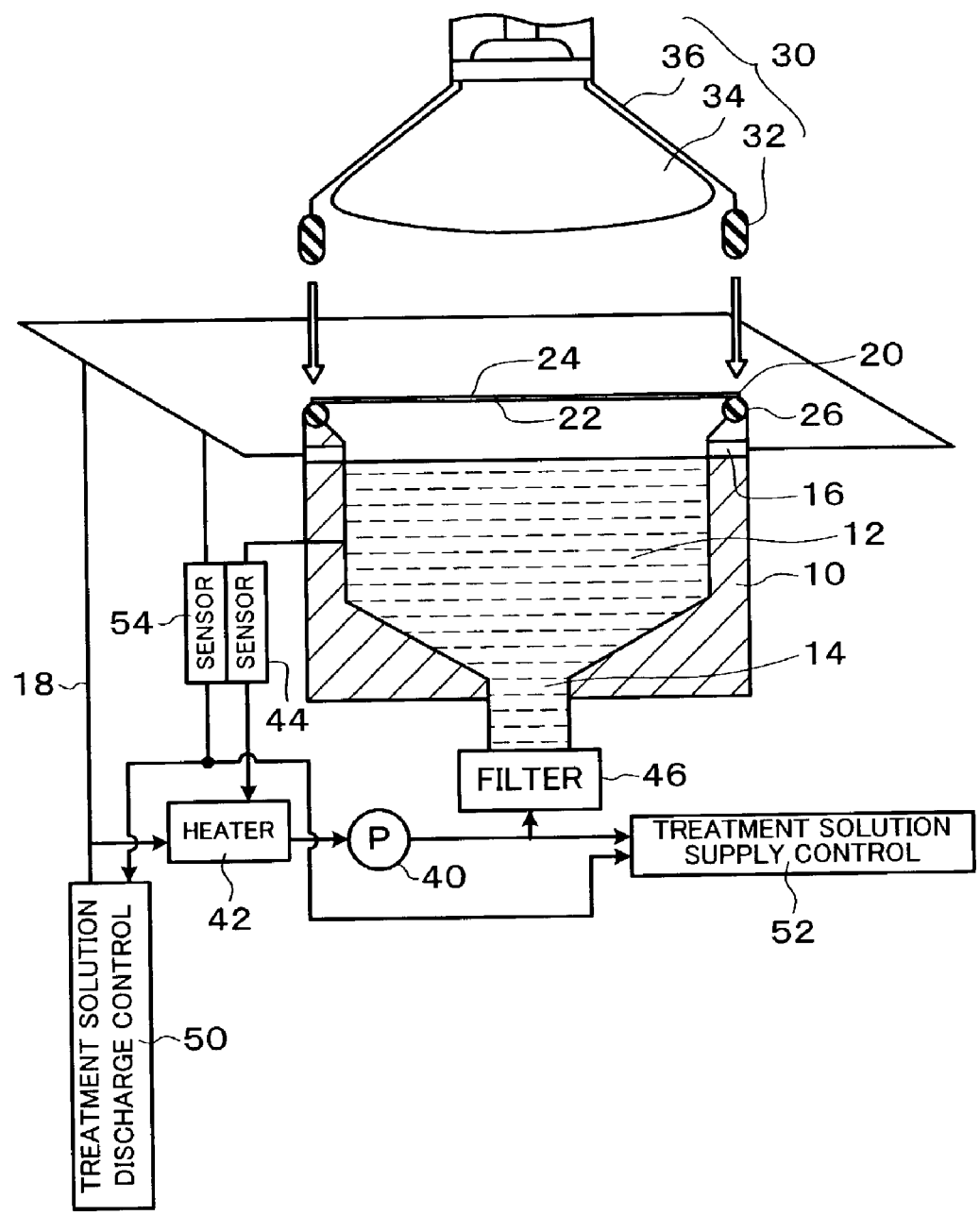
FIG. 1 shows an electroless plating apparatus according to a first embodiment of the present invention.

Embodiments of the present invention may enable high-quality electroless plating for an electroless plating apparatus, a semiconductor wafer having bumps, a semiconductor chip having bumps, methods of manufacturing the semiconductor wafer and the semiconductor chip, a semiconductor device, a circuit board, and electronic equipment.

(1) An electroless plating apparatus according to an embodiment of the present invention comprises:

a storage tank for an electroless plating solution;

a blocking member which blocks the electroless plating solution from flowing from a treatment side of a semiconductor wafer installed to the storage tank toward an opposite side to the treatment side, the treatment side being a side facing the electroless plating solution; and a solution supplier which causes the electroless plating solution to flow so that the electroless plating solution comes in contact with the treatment side of the semiconductor wafer.

According to this embodiment of the present invention, since the electroless plating solution does not flow toward the opposite side to the treatment side of the semiconductor wafer, high-quality plating can be performed by eliminating influence of the grounding effect.

(2) In this electroless plating apparatus, at least a surface of the blocking member may be formed only of an insulation material.

(3) In this electroless plating apparatus, the blocking member may be formed only of an insulation material.

(4) In this electroless plating apparatus, the solution supplier may cause the electroless plating solution to be jetted out.

(5) In this electroless plating apparatus, a level of the electroless plating solution may be increased by a jet of the electroless plating solution.

(6) In this electroless plating apparatus, the electroless plating solution may be intermittently caused to come in contact with the treatment side of the semiconductor wafer by allowing the level of the electroless plating solution to rise and fall repeatedly.

(7) This electroless plating apparatus may further comprise a pressure supplier which presses the semiconductor wafer in a direction toward the electroless plating solution.

(8) In this electroless plating apparatus, at least a surface of the pressure supplier may be formed only of an insulation material.

(9) In this electroless plating apparatus, the pressure supplier may apply pressure to the entire region of the semiconductor wafer in contact with the electroless plating solution from the opposite side.

(10) In this electroless plating apparatus, a closed space may be formed inside the storage tank to which the semiconductor wafer is installed.

(11) A method of manufacturing a semiconductor wafer having bumps according to another embodiment of the present invention comprises:

installing a semiconductor wafer having a plurality of pads in a storage tank of an electroless plating solution, and blocking the electroless plating solution from flowing from a treatment side of a semiconductor wafer installed to the storage tank toward an opposite side to the treatment side by means of a blocking member, the treatment side being a side facing the electroless plating solution; and forming bumps on the respective pads from the electroless plating solution by allowing the electroless plating solution to flow by means of a solution supplier so that the electroless plating solution comes in contact with the treatment side of the semiconductor wafer.

According to this embodiment of the present invention, since the electroless plating solution does not flow toward the opposite side to the treatment side of the semiconductor wafer, high-quality plating can be performed by eliminating influence of a grounding effect.

(12) In this method of manufacturing a semiconductor wafer having bumps, the electroless plating solution may be jetted out by the solution supplier.

(13) In this method of manufacturing a semiconductor wafer having bumps, a level of the electroless plating solution may be increased by a jet of the electroless plating solution.

(14) In this method of manufacturing a semiconductor wafer having bumps, the electroless plating solution may be intermittently caused to come in contact with the treatment side of the semiconductor wafer by allowing the level of the electroless plating solution to rise and fall repeatedly.

(15) In this method of manufacturing a semiconductor wafer having bumps, the semiconductor wafer may be pressed in a direction toward the electroless plating solution.

(16) In this method of manufacturing a semiconductor wafer having bumps, pressure may be applied to an entire region of the semiconductor wafer in contact with the electroless plating solution from the opposite side.

(17) In this method of manufacturing a semiconductor wafer having bumps, a resist layer having an opening which exposes at least part of each of the pads may be formed on the semiconductor wafer, and the electroless plating solution may be caused to flow into the openings.

(18) A method of manufacturing a semiconductor chip having bumps according to another embodiment of the present invention comprises:

manufacturing a semiconductor wafer having bumps by using the above method, and cutting the semiconductor wafer having bumps.

(19) A semiconductor wafer having bumps according to another embodiment of the present invention is manufactured by using the above method.

(20) A semiconductor chip having bumps according to another embodiment of the present invention is manufactured by using the above method.

(21) A semiconductor device according to another embodiment of the present invention comprises the above semiconductor chip having bumps, a substrate on which the semiconductor chip having bumps is mounted, and external terminals.

(22) A circuit board according to another embodiment of the present invention includes the above semiconductor chip having bumps mounted on the circuit board.

(23) A circuit board according to another embodiment of the present invention includes the above semiconductor device mounted on the circuit board.

(24) Electronic equipment according to yet another embodiment of the present invention comprises the above semiconductor device.

Embodiments of the present invention are described below with reference to the drawings.

First Embodiment

FIG. 1 shows an electroless plating apparatus according to a first embodiment of the present invention. The electroless plating apparatus includes a storage tank (flow tank such as a vertical cylindrical flow tank, for example) 10. An electroless plating solution (zincate treatment solution or electroless plating solution, for example) 12 is stored in the storage tank 10. A supply port (flow port, for example) 14 of the electroless plating solution 12 may be formed in the storage tank 10. The supply port 12 may be formed at a lower part (bottom, for example) of the storage tank 10. A discharge port (or overflow delivery port) 16 of the electroless plating solution 12 may be formed in the storage tank 10. The discharge port 16 may be formed at an upper part (upper part of the side, for example) of the storage tank 10. If the level of the electroless plating solution 12 becomes higher than the discharge port 16, the electroless plating solution 12 is discharged from the discharge port 16. The storage tank 10 does not have electrodes (anode and cathode) used for electroplating.

The storage tank 10 has an opening. The storage tank 10 is designed so that a semiconductor wafer 20 is installed therein. The semiconductor wafer 20 is disposed so that a treatment side (main surface, for example) 22 subjected to electroless plating faces the electroless plating solution 12. The electroless plating solution 12 is prevented from flowing from the treatment side 22 toward a back side 24 of the semiconductor wafer 20. A blocking member (sealing section, for example) 26 is used for this purpose. The blocking member 26 may be formed of an elastic material (polytetrafluoroethylene (Teflon™) or rubber, for example). At least the surface of the blocking member 26 may be formed only of an insulating material. The entire blocking member 26 may be formed only of an insulating material. The blocking member 26 is disposed between the semiconductor wafer 20 and the storage tank 10. In the example shown in FIG. 1, the blocking member 26 is disposed between the treatment side 22 (periphery of the treatment side) of the semiconductor wafer 20 and the upper end of the side wall of the storage tank 10. As a modification example, the blocking member 26 may be disposed between the side of the semiconductor wafer 20 and the inner side of the storage tank 10. The blocking member 26 may be secured to the storage tank 10. The flow of the electroless plating solution 12 is blocked by allowing the blocking member 26 to adhere to the storage tank 10 and the semiconductor wafer 20. Specifically, fluid tightness is maintained between the semiconductor wafer 20 and the storage tank 10. A closed space may be formed inside the storage tank 10 in which the semiconductor wafer 20 is installed.

The electroless plating apparatus includes a pressure supplier 30. The pressure supplier 30 includes a buffer (or pressing section) 32. The buffer 32 may be formed of an elastic material (polytetrafluoroethylene (Teflon™) or rubber, for example). At least the surface of the buffer 32 may be formed only of an insulating material. The entire buffer 32 may be formed only of an insulating material. The buffer 32 is provided at a position which faces the blocking member 26. The semiconductor wafer 20 is sandwiched between the buffer 32 and the blocking member 26. This enables fluid tightness to be provided between the semiconductor wafer 20 and the storage tank 10. If the surface of the blocking member 26 and the surface of the buffer 32 are formed only of an insulating material, the semiconductor wafer is insulated from the outside during electroless plating. As a result, the grounding effect can be prevented more effectively.

The pressure supplier 30 includes an expansion bag 34. The expansion bag 34 is formed of a material which can be expanded by a fluid (gas such as air or $N_2$ or liquid). The expansion bag 34 may be formed of polytetrafluoroethylene (Teflon™) or rubber. The expansion bag 34 is provided inside a support section 36 and is capable of applying pressure from an opening of the support section 36 when expanded.

According to the present embodiment, the pressure supplier 30 (expansion bag 34) presses the semiconductor wafer 20 in the direction toward the electroless plating solution 12. The pressure supplier 30 (expansion bag 34) applies pressure to the entire region of the semiconductor wafer 20 in contact with the electroless plating solution 22 (region inside the blocking member 26) from the back side 24. The pressure applied to the entire region of the semiconductor wafer 20 in contact with the electroless plating solution 22 (region inside the blocking member 26) by the pressure supplier 30 (expansion bag 34) may be a force opposite to the jet pressure of the electroless plating solution 12.

The plating apparatus may include a circulating path 18. The circulating path 18 connects the discharge port 16 with the supply port 14. The electroless plating solution 12 circulates in the circulating path 18.

The electroless plating apparatus may include a solution supplier (pump, for example) 40. The solution supplier 40 may be provided in the circulating path 18. The solution supplier 40 causes the electroless plating solution 12 to flow so that the electroless plating solution 12 comes in contact with the treatment side 22 of the semiconductor wafer 20. For example, the solution supplier 40 causes the electroless plating solution 12 to be jetted. The level of the electroless plating solution 12 may be increased by the jet of the electroless plating solution 12. The electroless plating solution 12 may be intermittently caused to come in contact with the treatment side 22 of the semiconductor wafer 20 by allowing the level of the electroless plating solution 12 to rise and fall repeatedly.

A heater (heating mechanism) 42 may be provided in the circulating path 18. The electroless plating solution 12 is heated by the heater 42. This enables the temperature of the electroless plating solution 12 to be maintained within a specific range (90° C. to 95° C., for example). If the electroless plating solution 12 is a zincate treatment solution, the temperature of the zincate treatment solution may be maintained at 15° C. to 30° C., and preferably 20° C. ±5° C. If the electroless plating solution 12 is an electroless Ni plating solution, the temperature of the electroless Ni plating solution may be maintained at 40° C. to 60° C., and preferably 50° C. ±5° C. The temperature of the electroless plating solution 12 which is stored in the storage tank 10 or circulates in the circulating path 18 may be detected by a sensor 44, and the heater 42 may be controlled based on the results detected by the sensor 44.

A filter 46 may be provided in the circulating path 18. Normal components of the electroless plating solution 12 can be maintained by removing refuse such as plating deposits by the filter 46. If the filter 46 is provided directly before the supply port 14, the electroless plating solution 12 immediately after removing refuse can be supplied to the storage tank 10. If the filter 46 is provided directly after the discharge port 16, the electroless plating solution 12 can be allowed to circulate after removing the refuse. The filter 46 may be provided directly before the heater 42 or the solution supplier 40. This prevents refuse from entering the heater 42 or the solution supplier 40. This enables the lifetime of the heater 42 or the solution supplier 40 to be increased, whereby a decrease in performance can be prevented. As a result, reliability is increased.

The circulating path 18 may be connected with a treatment solution discharge control section (treatment solution discharge control mechanism) 50. Any unnecessary electroless plating solution 12 is discharged from the treatment solution discharge control section 50.

The circulating path 18 may be connected with a treatment solution supply control section (treatment solution supply control mechanism) 52. The treatment solution supply control section 52 is used to replenish the electroless plating solution 12 and may include a replenishment solution storage tank (not shown). For example, components of the electroless plating solution 12 which is stored in the storage tank 10 or circulates in the circulating path 18 may be detected by a sensor 54, and the electroless plating solution 12 may be replenished based on the results detected by the sensor 54. Any unnecessary electroless plating solution 12 may be discharged from the treatment solution discharge control section 50 based on the results detected by the sensor (concentration sensor) 54. This enables utilization of the electroless plating solution 12 containing normal components.

According to the present embodiment, since the electroless plating solution 12 does not flow toward the back side 24 of the semiconductor wafer 20, high-quality plating can be performed by eliminating the influence of the grounding effect. Moreover, the electroless plating solution 12 always containing uniform components is supplied only to the treatment side (main surface) 22 of the semiconductor wafer 20. Furthermore, it is unnecessary to apply a resist to the back side of the semiconductor wafer 20 since the semiconductor wafer 20 is not affected by the grounding effect. Therefore, damage to the treatment side (main surface) 22 of the semiconductor wafer 20 can be eliminated.

The plating apparatus according to the present embodiment has the above-described configuration. A plating method using the plating apparatus is described below. The semiconductor wafer 20 is installed in the storage tank 10 by using a robot arm (not shown) or the like, or by hand. For example, the treatment side 22 (periphery of the treatment side) of the semiconductor wafer 20 is disposed on the blocking member 26.

As shown in FIG. 1, the semiconductor wafer 20 (periphery of the semiconductor wafer) is held between the buffer 32 and the blocking member 26. This enables the semiconductor wafer 20 to adhere to the blocking member 26, whereby the electroless plating solution 12 can be prevented from flowing from the treatment side 22 toward the back side 24 of the semiconductor wafer 20. Moreover, the semiconductor wafer 20 can be secured by the buffer (pressing section) 32 and the blocking member (sealing section) 26. Since a fluid such as air is not placed in the expansion bag (pressing bag) 34 until the installation of the semiconductor wafer 20 in the storage tank 10 is finished, pressure is not applied to the back side 24 of the semiconductor wafer 20.

Figure 2:
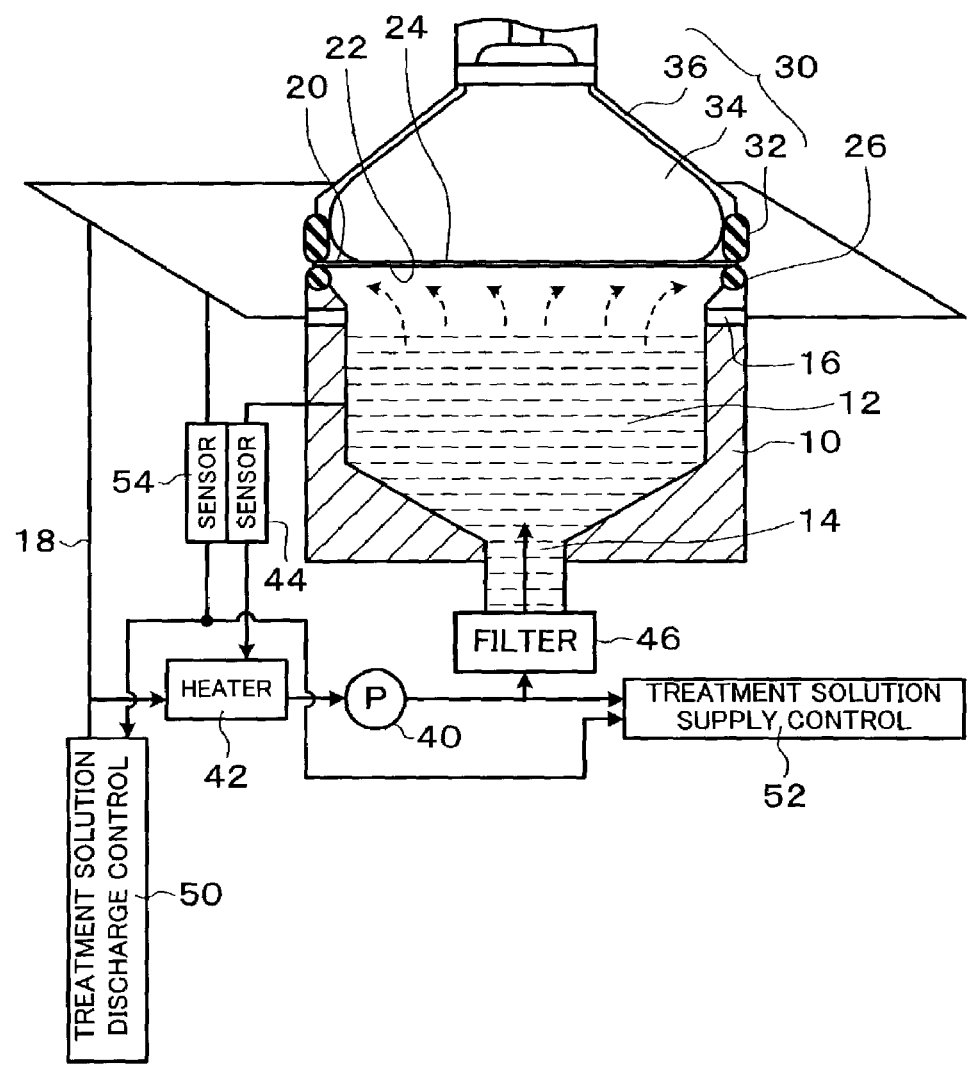
FIG. 2 illustrates the operation of the electroless plating apparatus according to the first embodiment of the present invention.

The semiconductor wafer 20 is pressed by the pressure supplier 30 in the direction toward the electroless plating solution 12 (see FIG. 2). For example, pressure is applied to the semiconductor wafer 20 by expanding the expansion bag 34 by introducing a fluid such as air or $N_2$ gas into the expansion bag 34. The semiconductor wafer 20 may be heated by introducing a heated fluid into the expansion bag 34. The pressure may be uniformly applied to the entire surface of the back side 24 of the semiconductor wafer 20. In more detail, the pressure may be applied to the entire region of the semiconductor wafer 20 in contact with the electroless plating solution 12 from the back side 24.

As shown in FIG. 2, the electroless plating solution 12 is caused to flow by operating the solution supplier 40 so that the electroless plating solution 12 comes in contact with the treatment side 22 of the semiconductor wafer 20. For example, the electroless plating solution 12 may be jetted, or the level of the electroless plating solution 12 may be increased by the jet of the electroless plating solution 12. If the rising speed of the level of the electroless plating solution 12 exceeds the discharge speed, the level of the electroless plating solution 12 is maintained at a position higher than the discharge port 16 even if the level of the electroless plating solution 12 exceeds the height of the discharge port 16.

When the electroless plating solution 12 is in short supply, the electroless plating solution 12 may be supplied by the treatment solution supply control section 52. The electroless plating solution 12 may be additionally supplied based on the results for the components of the electroless plating solution 12 detected by the sensor 54. According to the present embodiment, since the electroless plating solution 12 is jetted or circulates through the filter 46, the electroless plating solution 12 containing no refuse always comes in contact with the treatment side 22 of the semiconductor wafer 20. Other operations are naturally derived from the above-described configuration.

Figure 3:
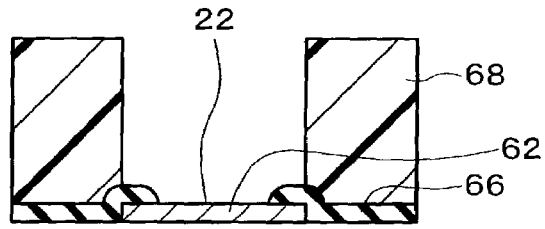
FIG. 3 illustrates a method of manufacturing a semiconductor wafer having bumps according to the first embodiment of the present invention.

A method of manufacturing a semiconductor wafer having bumps according to the present embodiment is described below. FIG. 3 shows details of the treatment side 22 of the semiconductor wafer 20 shown in FIG. 1. A pad 62 is formed on the treatment side 22 of the semiconductor wafer 20. The pad 62 may be formed of aluminum, for example. A plurality of integrated circuits 64 (see FIG. 5) is formed on the semiconductor wafer 20. The pad 62 is electrically connected with one of the integrated circuits 64. The semiconductor wafer 20 is cut (diced or scribed, for example) into a plurality of semiconductor chips. Each semiconductor chip has one integrated circuit 64.

A passivation film 66 is formed on the semiconductor wafer 20. The passivation film 66 may be an uppermost layer of the semiconductor wafer 20. The passivation film 66 may be formed to avoid a cutting line (dicing line or scribing line, for example). The passivation film 66 may be formed of $SiO_2$, SiN, or a resin such as polyimide. The passivation film 66 is formed to expose part (center, for example) of the pad 62. The passivation film 66 may cover part (edge, for example) of the pad 62.

In the present embodiment, a bump is formed on the pad 62 by electroless plating. A resist layer 68 is formed on the semiconductor wafer 20. The resist layer 68 is formed to expose part (center, for example) of the pad 62. Specifically, an opening which exposes part of the pad 62 is formed in the resist layer 68. The resist layer 68 may be placed on the passivation film 66 in the area which covers part (edge, for example) of the pad 62. The resist layer 68 patterned in this manner controls the direction of the growth of plating. Since the growth of plating in the lateral direction is controlled by the resist layer 68, bumps with a small width or at a narrow pitch can be formed. The semiconductor wafer 20 has already been subjected to a cleaning step and the like.

A zincate treatment is performed in the electroless plating, for example. In this case, the plating apparatus shown in FIG. 1 is provided and a zincate treatment solution is stored in the storage tank 10 as the electroless plating solution 12. The semiconductor wafer 20 on which the resist layer 68 is formed is installed in the storage tank 10. The electroless plating solution 12 is caused to come in contact with the treatment side 22 of the semiconductor wafer 20, as shown in FIG. 2. The details are the same as described above.

Figure 4A:
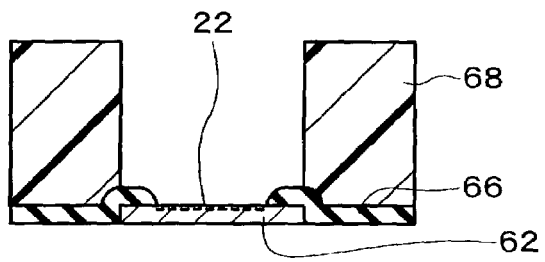
FIGS. 4A to 4D illustrate a method of manufacturing a semiconductor wafer having bumps according to the first embodiment of the present invention.

As shown in FIG. 4A, the surface of the pad 62 is replaced by Zn by the zincate treatment. Specifically, the surface of the pad 62 is replaced by Zn according to the reaction shown by $2Al+3Zn^{2+} \rightarrow 2Al^{3+}+3Zn$.

According to the present embodiment, bubbles can be prevented from entering the opening in the resist layer 68 as much as possible by the jet of the electroless plating solution 12. The level of the electroless plating solution 12 may be allowed to rise and fall repeatedly by ON/OFF controlling the solution supplier 40. This enables the electroless plating solution 12 to come in contact with the treatment side 22 of the semiconductor wafer 20 successively several times. Therefore, bubbles can be intermittently released so that the bubbles do not remain at the same position inside the opening in the resist layer 68. The semiconductor wafer 20 may be allowed to be in an electrically insulated state (floating state) during at least one of the plating treatment and the zincate treatment. In this case, the grounding effect can be prevented more effectively.

Since the electroless plating solution 12 is allowed to come in contact with the treatment side 22 of the semiconductor wafer 20 so that the electroless plating solution 12 does not reach the back side 24 of the semiconductor wafer 20, the potential of the pad 62 is not changed. Therefore, failure relating to the zincate treatment which may affect the subsequent deposition of a plating metal does not occur. Specifically, all the pads 68 can be uniformly subjected to the zincate treatment without being affected by the grounding effect.

Figure 4B:
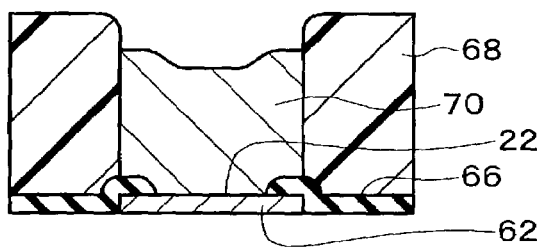

As shown in FIG. 4B, a metal (Ni, for example) is deposited. In this case, an electroless plating apparatus in which an electroless plating solution (electroless Ni plating solution, for example) is stored in the storage tank 10 as the electroless plating solution 12 is provided. It is realistic to provide the plating apparatus for depositing a metal separately from the plating apparatus for the zincate treatment.

The electroless plating solution 12 is allowed to come in contact with the treatment side 22 of the semiconductor wafer 20. In the case of electroless Ni plating, a replacement reaction between Zn and Ni occurs on the surface of the pads 62 subjected to the zincate treatment. Specifically, displacement plating takes place due to a difference in the ionization tendency between Ni and Zn. Ni is then deposited on the Ni plating according to the reaction shown by $Ni^{2+}+2H_2PO_2^- \rightarrow 2H_2PO_3^-+Ni+2H+H_2$. Details of other effects are the same as those described relating to the zincate treatment. Bumps 70 are formed by uniformly plating all the pads 68 with Ni. Since the electroless plating solution 12 is jetted through the filter 46, the electroless plating solution 12 containing no refuse always comes in contact with the treatment side 22 of the semiconductor wafer 20. This increases the growth rate of the plating and improves uniformity of the height of the plating.

Figure 4C:
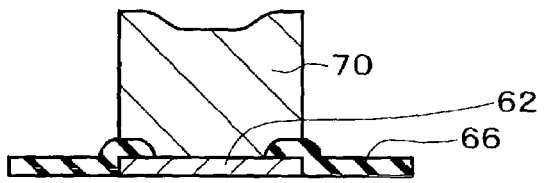
Figure 4D:
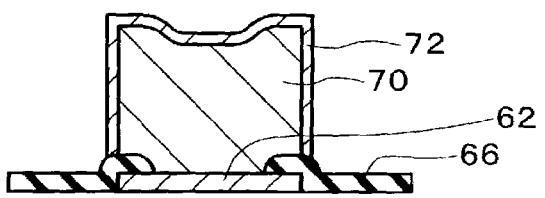

The resist layer 68 is removed as shown in FIG. 4C. As shown in FIG. 4D, another metal (Au, for example) may optionally be deposited on the bumps 70 consisting of a single layer on the pads 62. In this case, an electroless plating apparatus in which an electroless plating solution differing from that used in the step shown in FIG. 4B (electroless Au plating solution, for example) is stored in the storage tank 10 as the electroless plating solution 12 is provided. It is realistic to provide the electroless plating apparatus for further depositing a metal on the bumps 70 separately from the plating apparatus for forming the bumps 70 consisting of a single layer.

The electroless plating solution 12 is allowed to come in contact with the treatment side 22 of the semiconductor wafer 20. In the case of electroless Au plating, displacement plating shown by $3Ni+2Au^{3+} \rightarrow 3Ni^{2+}+2Au$ takes place on the surface of the bumps 70 (layer formed of Ni) due to a difference in the ionization tendency between Ni and Au. Au is then electrolessly deposited on the Au plating on the semiconductor wafer 20 by using a quinone-type reducing agent, for example. Details of other effects are the same as those described relating to the electroless plating for forming the bumps 70. A coating layer (second layer) 72 for the bumps 70 is formed by uniformly plating all the bumps 70 with Au. The coating layer 72 formed of Au not only improves electrical connection, but also contributes to an increase in tolerance against oxidation or migration of the bumps 70 formed of Ni.

A semiconductor wafer having bumps can be manufactured by these steps.

Figure 5:
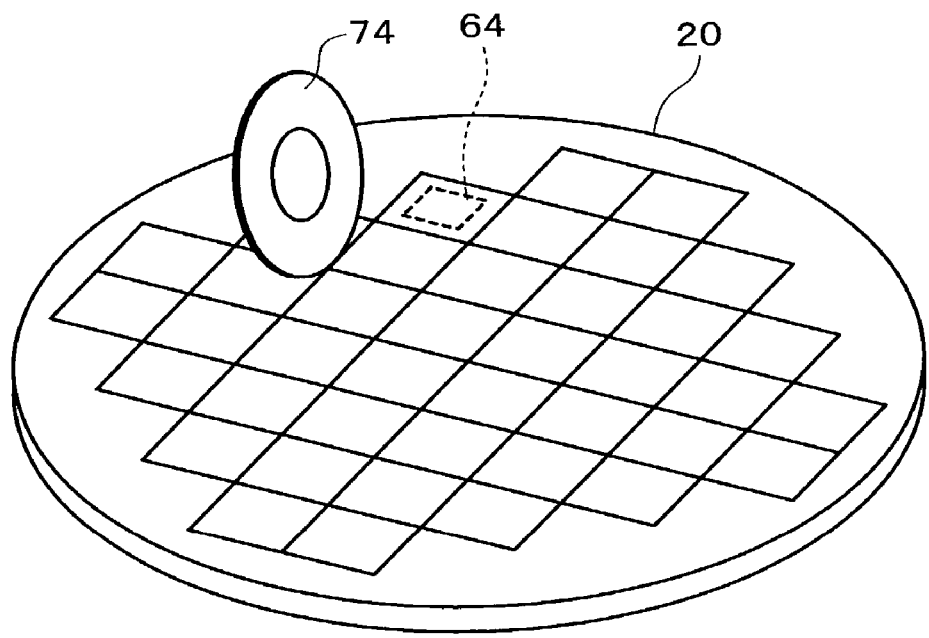
FIG. 5 illustrates a method of manufacturing a semiconductor chip having bumps according to the first embodiment of the present invention.

As shown in FIG. 5, the semiconductor wafer 20 is cut by using a tool (cutter such as dicer or scriber) 74 to obtain individual semiconductor chips (semiconductor chips having bumps).

Figure 6:
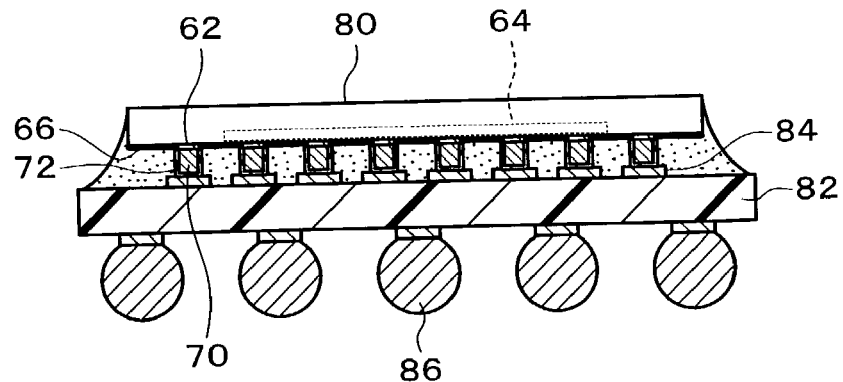
FIG. 6 shows a semiconductor device according to the first embodiment of the present invention.

FIG. 6 shows a semiconductor device according to the present embodiment. The semiconductor device includes a semiconductor chip 80. The semiconductor chip 80 includes an integrated circuit 64. A plurality of pads 62 is electrically connected with the integrated circuit 64. The passivation film 66 covers part (center, for example) of each of the pads 62 and exposes other regions. The bump 70 is formed on each of the pads 62. Part of the bump 70 may be a single layer placed in the area of the pad 62 exposed from the passivation film 66 and on the passivation film 66. The coating layer 72 may be formed on the outer side of the bump 70.

The semiconductor chip 80 is mounted (bonded face down, for example) on a substrate (ceramic substrate or flexible substrate, for example) 82. An interconnect pattern 84 is formed on the substrate 82. The interconnect pattern 84 and the bumps 70 are electrically connected. An anisotropic conductive material (anisotropic conductive film or anisotropic conductive paste) or a conductive material (conductive paste or the like) may be used for the electrical connection between the interconnect pattern 84 and the bumps 70. In addition, a metal junction may be applied or an insulating adhesive may be used. External terminals (solder balls, for example) 86 may be provided on the substrate 82.

Figure 7:
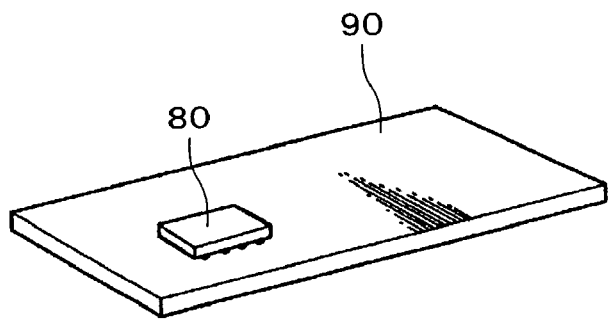
FIG. 7 shows a circuit board on which the semiconductor chip according to the first embodiment of the present invention is mounted.

FIG. 7 shows a circuit board on which the semiconductor chip according to the present embodiment is mouned. The semiconductor chip 80 is mounted (flip-chip bonded, for example) on a circuit board (motherboard) 90. An interconnect pattern (not shown) is formed on the circuit board 90.

Figure 8:
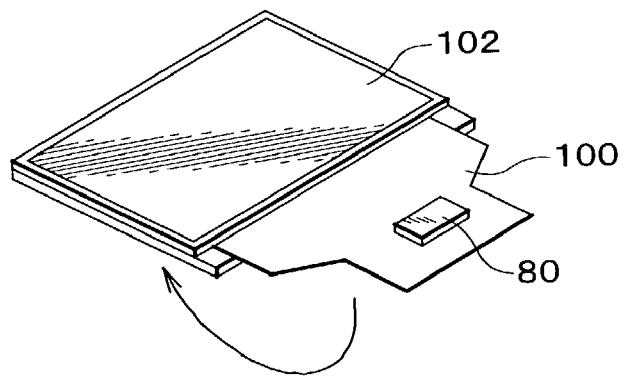
FIG. 8 shows a semiconductor device on which the semiconductor chip according to the first embodiment of the present invention is mounted.

FIG. 8 shows a semiconductor device on which the semiconductor chip according to the present embodiment is mounted. In the semiconductor device, the semiconductor chip 80 is mounted on a substrate 100 to make up a TCP (Tape Carrier Package). This semiconductor device is bonded to an electronic panel (liquid crystal panel or electroluminescent panel, for example) 102. The mounting form of the semiconductor chip 80 may be COG (Chip On Glass) or COF (Chip On Film/Flexible).

Figure 9:
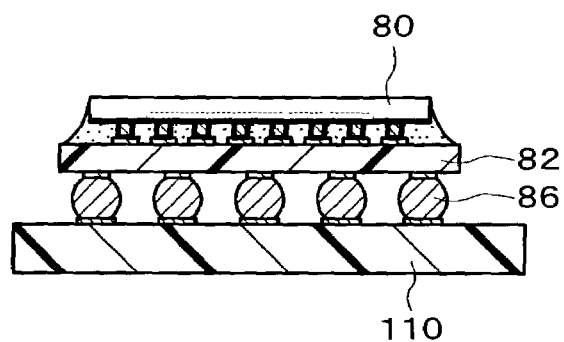
FIG. 9 shows a circuit board on which the semiconductor device shown in FIG. 6 is mounted.
Figure 10:
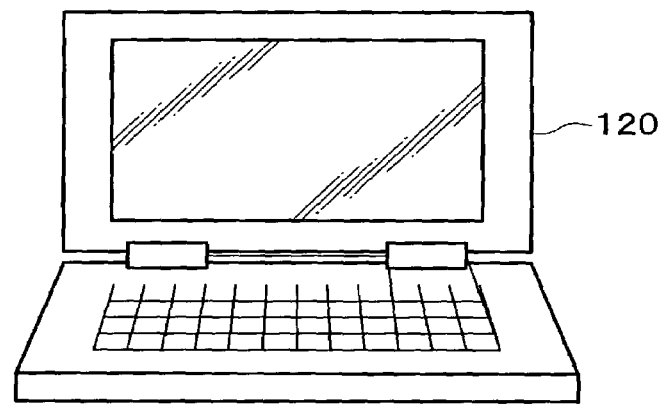
FIG. 10 shows electronic equipment including a semiconductor device according to an embodiment of the present invention.
Figure 11:
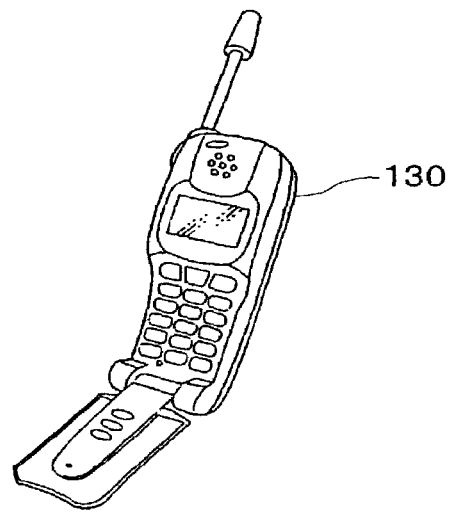
FIG. 11 shows electronic equipment including a semiconductor device according to an embodiment of the present invention.

FIG. 9 shows a circuit board 110 on which the semiconductor device shown in FIG. 6 is mounted. FIGS. 10 and 11 respectively show a notebook-type personal computer 120 and a portable telephone 130 as examples of electronic equipment including the semiconductor device to which the present invention is applied.

Second Embodiment

Figure 12:
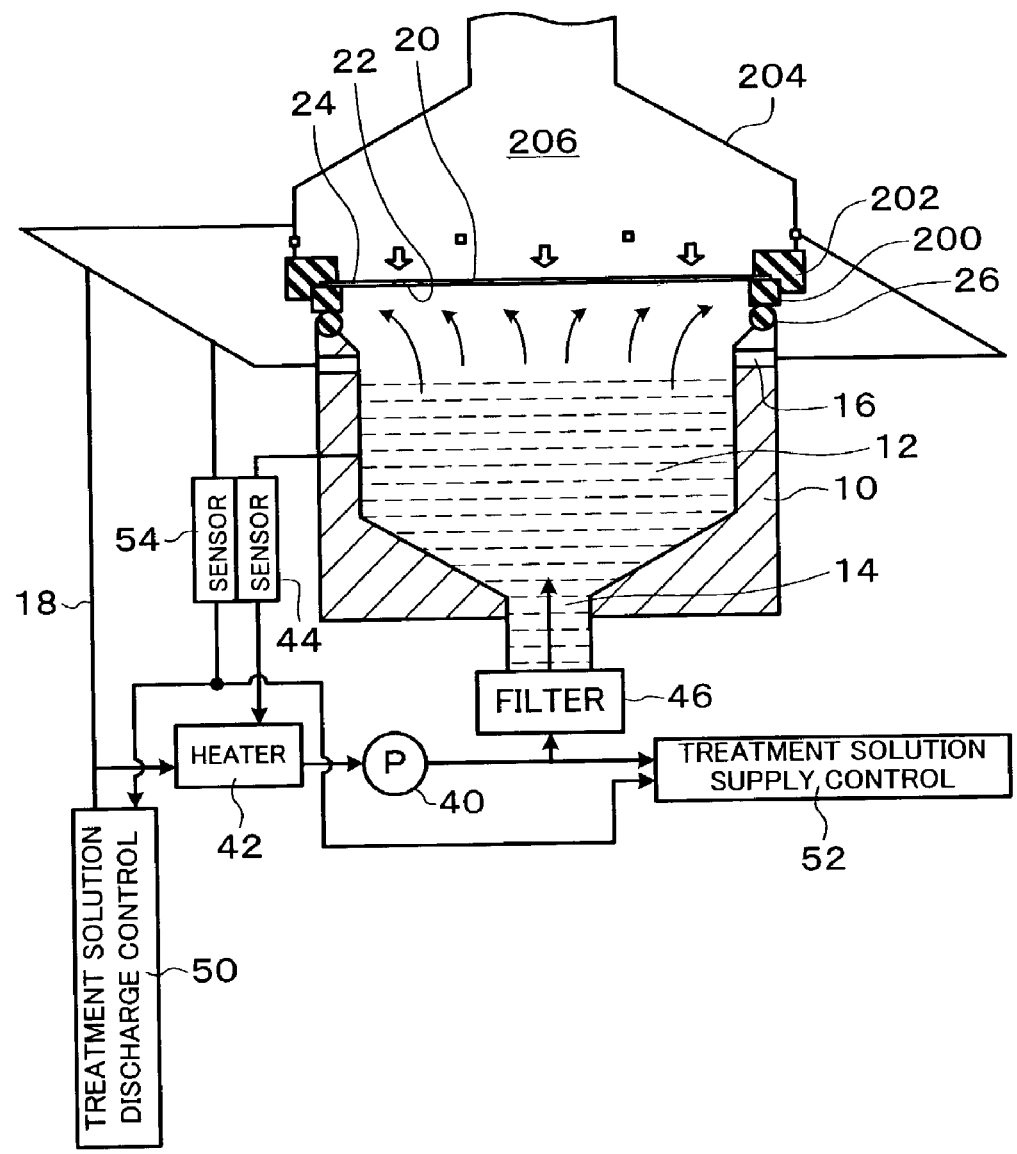
FIG. 12 illustrates an electroless plating apparatus according to a second embodiment of the present invention and the operation of the electroless plating apparatus.

FIG. 12 shows an electroless plating apparatus according to a second embodiment of the present invention. The electroless plating apparatus according to the present embodiment differs from the plating apparatus of the first embodiment in the mechanism for pressing the semiconductor wafer 20 or the mechanism for securing the semiconductor wafer 20.

The semiconductor wafer 20 is held by first and second holding sections 200 and 202. In more detail, the periphery of the semiconductor wafer 20 is placed on the first holding section (support ring) 200. The first holding section 200 may project outside the semiconductor wafer 20. The second holding section (pressing cylindrical section) 202 holds the first holding section 200. For example, the second holding section 202 may be in contact with the side of the first holding section 200 by friction force and hold the first holding section 200 and the semiconductor wafer 20. The second holding section 202 presses the first holding section 200 in the direction toward the blocking member 26. This causes the first holding section 200 to adhere to the blocking member 26, thereby preventing the electroless plating solution 12 from flowing from the treatment side 22 toward the back side 24 of the semiconductor wafer 20. The second holding section 202 may press the back side 24 of the semiconductor wafer 20. At least one of the first and second holding sections 200 and 202 maybe formed of an elastic material (polytetrafluoroethylene (Teflon™) or rubber). The surface of at least one of the first and second holding sections 200 and 202 may be formed of an insulating material. At least one of the first and second holding sections 200 and 202 may be entirely formed of an insulating material.

The first and second holding sections 200 and 202 or the second holding section 202 and the semiconductor wafer 20 adhere to each other so as to maintain an airtight state. A support section 204 to which the second holding section 202 is attached is closed by the semiconductor wafer 20, whereby a chamber 206 is formed. The semiconductor wafer 20 is pressed by introducing a fluid (gas such as air or $N_2$) into the chamber 206. Specifically, the plating apparatus according to the present embodiment also includes a pressure supplier. The effects of the pressure supplier are the same as the effects of the expansion bag 34 described in the first embodiment.

Figure 13:
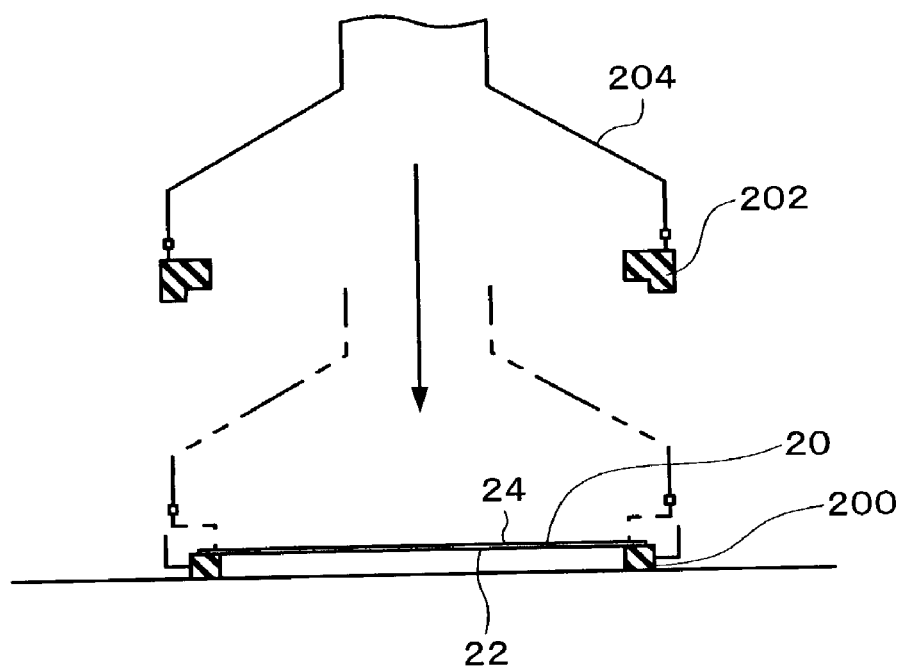
FIG. 13 illustrates the electroless plating apparatus according to the second embodiment of the present invention and the operation of the electroless plating apparatus.
Figure 14:
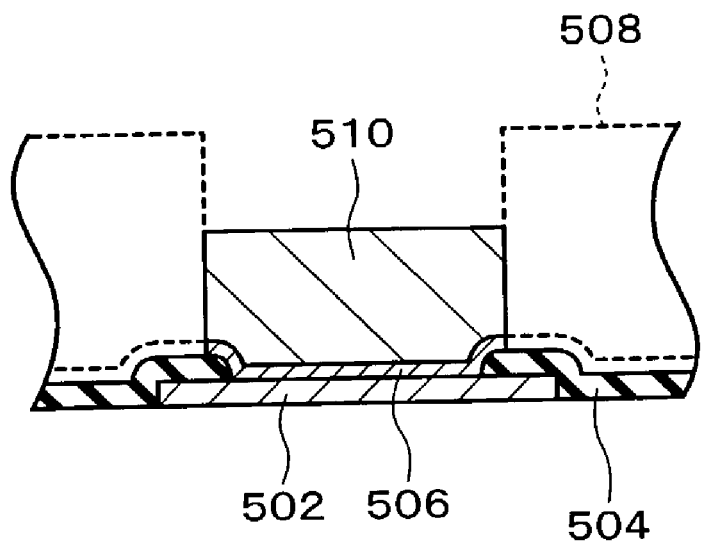
FIG. 14 illustrates prior art of the present invention.

The operation of the plating apparatus according to the present embodiment is described below. As shown in FIG. 13, the semiconductor wafer 20 is placed on the first holding section 200. For example, the periphery of the treatment side 22 of the semiconductor wafer 20 may be disposed on the first holding section 200 by holding the semiconductor wafer 20 (periphery (edge) of the semiconductor wafer 20, for example) using a robot arm (not shown) or the like. A step which is less than the thickness of the semiconductor wafer 20 may be provided in the first holding section 200. The semiconductor wafer 20 can be positioned by utilizing the step.

The second holding section 202 is engaged with the first holding section 200, whereby the semiconductor wafer 20 is held by the first and second holding sections 200 and 202. The semiconductor wafer 20 is installed in the storage tank 10 by using the support section 204. The description of the first embodiment applies to the subsequent steps. An air vent may be provided in the second holding section 202. This enables the pressure of the fluid in the chamber 206 to be maintained at a constant level.

In the above-described embodiments, the electroless plating solution 12 may be a liquid other than the zincate treatment solution and the electroless plating solution insofar as the liquid is used in a step relating to the plating. For example, the present invention may be applied to removal of an oxide film on the pads 62, rinsing performed between the treatments using a treatment solution, or the etching step. The present invention may be applied to a case where a plating metal is a metal other than Ni and Au which can be deposited by electroless plating (Cu or Sn, for example). When forming the bumps by electroless plating with a metal other than Ni and Au, a treatment solution, temperature conditions, and the like corresponding to the metal are appropriately employed. In this case, conditions which enable high-quality plating at a high plating rate are selected. A simple rinsing tank, dipping tank, and the like may be used in combination with the electroless plating apparatus according to the present invention.

The present invention is not limited to the above-described embodiments and various modifications and variations are possible. For example, the present invention includes configurations essentially the same as the configurations described in the embodiments (for example, configurations having the same function, method, and results, or configurations having the same object and results). The present invention includes configurations in which any unessential part of the configuration described in the embodiments is replaced. The present invention includes configurations having the same effects or achieving the same object as the configurations described in the embodiments. The present invention includes configurations in which conventional technology is added to the configurations described in the embodiments.

What is claimed is:

1. A method of manufacturing a semiconductor wafer having bumps comprising:
   installing a semiconductor wafer having a plurality of pads in a storage tank of an electroless plating solution, and blocking the electroless plating solution from flowing from a treatment side of a semiconductor wafer installed to the storage tank toward an opposite side to the treatment side by means of a blocking member, the treatment side being a side facing the electroless plating solution; and
   forming bumps on the respective pads from the electroless plating solution by allowing the electroless plating solution to flow by means of a solution supplier so that the electroless plating solution comes in contact with the treatment side of the semiconductor wafer.

2. The method of manufacturing a semiconductor wafer having bumps as defined by claim 1,
   wherein the electroless plating solution is jetted out by the solution supplier.

3. The method of manufacturing a semiconductor wafer having bumps as defined by claim 2,
   wherein a level of the electroless plating solution is increased by a jet of the electroless plating solution.

4. The method of manufacturing a semiconductor wafer having bumps as defined by claim 3,
   wherein the electroless plating solution is intermittently caused to come in contact with the treatment side of the semiconductor wafer by allowing the level of the electroless plating solution to rise and fall repeatedly.

5. The method of manufacturing a semiconductor wafer having bumps as defined by claim 1,
   wherein the semiconductor wafer is pressed in a direction toward the electroless plating solution.

6. The method of manufacturing a semiconductor wafer having bumps as defined by claim 5,
   wherein pressure is applied to an entire region of the semiconductor wafer in contact with the electroless plating solution from the opposite side.

7. The method of manufacturing a semiconductor wafer having bumps as defined by claim 1,
   wherein a resist layer having an opening which exposes at least part of each of the pads is formed on the semiconductor wafer, and
   wherein the electroless plating solution is caused to flow into the openings.

8. A method of manufacturing a semiconductor chip having bumps comprising:
   manufacturing a semiconductor wafer having bumps by using the method as defined by claim 1; and
   cutting the semiconductor wafer having bumps.

9. A semiconductor wafer having bumps manufactured by using the method as defined by claim 1.

10. A semiconductor chip having bumps manufactured by using the method as defined by claim 8.

11. A semiconductor device comprising:
    the semiconductor chip, as defined by claim 10, having bumps;
    a substrate on which the semiconductor chip having bumps is mounted; and
    external terminals.

12. A circuit board on which the semiconductor chip, as defined by claim 10, having bumps is mounted.

13. A circuit board on which the semiconductor device, as defined by claim 11, is mounted.

14. Electronic equipment comprising the semiconductor device as defined by claim 11.

* * * * *